United States Patent [19]

Inada et al.

[11] Patent Number: 4,483,735
[45] Date of Patent: Nov. 20, 1984

[54] MANUFACTURING PROCESS OF SEMI-INSULATING GALLIUM ARSENIDE SINGLE CRYSTAL

[75] Inventors: Tomoki Inada; Seiji Mizuniwa; Toshiya Toyoshima; Masashi Fukumoto; Junkichi Nakagawa, all of Hitachi, Japan

[73] Assignee: Hitachi Cable, Ltd., Tokyo, Japan

[21] Appl. No.: 474,332

[22] Filed: Mar. 11, 1983

[30] Foreign Application Priority Data

Mar. 19, 1982 [JP] Japan ................................. 57-45340

[51] Int. Cl.$^3$ ...................... C30B 27/02; H01L 21/18
[52] U.S. Cl. ............................ 156/607; 156/DIG. 70
[58] Field of Search ......... 156/607, 617 SP, DIG. 65, 156/DIG. 70, DIG. 89

[56] References Cited

U.S. PATENT DOCUMENTS 4,299,651  11/1981  Bonner .......................... 156/617 SP

FOREIGN PATENT DOCUMENTS 0123585  9/1979  Japan ................................. 156/607

OTHER PUBLICATIONS

"Growth and Characterization of Large Diameter Undoped Semi-Insulating GaAs for Direct Ion Implanted FET Technology", Thomas et al., Solid State Electronics, vol. 24, 1981, pp. 387-399.

Primary Examiner—Hiram H. Bernstein
Assistant Examiner—Joseph P. Carrier
Attorney, Agent, or Firm—Birch, Stewart, Kolasch & Birch

[57] ABSTRACT

The present invention relates to the manufacturing process of semi-insulating gallium arsenide single crystal by pulling a seed crystal contacted with gallium arsenide melt which is obtained by heat-reacting gallium and arsenic in a crucible contained in a pressure container and is characteristic in providing a film layer of 8-20 mm thickness of melted boron oxide with less than 200 ppm water content under pressure controlled at 60 kg/cm$^2$ and over during reaction and at 5-40 kg/cm$^2$ during crystal growth in high purity inert gas atmosphere, and during said crystal growth, rotating said seed crystal and said crucible in the same direction, but said seed crystal being rotated 5-30 rpm faster than the said crucible, and setting the crystal growing plane of said seed crystal to be within ±3° from {100} plane.

1 Claim, 2 Drawing Figures

MANUFACTURING PROCESS OF SEMI-INSULATING GALLIUM ARSENIDE SINGLE CRYSTAL

BACKGROUND OF THE INVENTION

The present invention relates to the improvement of manufacturing process of semi-insulating gallium arsenide single crystal to be applied as substrates of optical elements or magnetic elements.

Semi-insulating gallium arsenide single crystals are applied as substrates of various microwave elements, optical elements, magnetic elements, etc. In these years, they have been put into practical use for integrated circuits (IC) and large scale integrated circuits (LSI) since the techniques have been developed for ion implantation into such substrates. A certain degree of thermal treatment is required in the process of ion implantation, and therefore the substrates are required to have thermally stable electric properties. Moreover, in case that they are applied as substrates for IC or LSI, they should have much higher resistivity than that of conventional semi-insulating materials; i.e. $10^7$–$10^8$ $\Omega\cdot cm$ and over at 300° K.

In order to satisfy the above requirements, the following processes have been adopted conventionally:
(1) Process for growing chrome doped single crystal
(2) Process for growing oxygen doped single crystal
(3) Process for growing undoped single crystal having low impurity concentration Among the above three processes, the (1) and (2) processes are the ones to compensate electrically the conductive levels by doping, which are of impurities of Si and Cu, of vacancies of Ga and As and of compounds of impurities and vacancies.

It is difficult to control doping quantities of chrome by the above (1) process, because the segregation coefficient of chrome to gallium arsenide is so small as about $6 \times 10^{-4}$ and the doping of chrome into gallium arsenide crystal becomes difficult. Moreover, it has such problems that, if excessive chrome is doped for the purpose to stabilize the electric properties of the crystal, dislocation and precipitates are observed in the crystal and that, if small quantity of chrome is doped, the crystal becomes thermally instable.

It is hard to carry out doping control in the above (2) process and the crystal has low thermal stability. As a technique to practice the above (3) process, a direct synthesized liquid encapsulated pulling method is described in the following reference: Pekarek et. al : Czech. J. Phys., 20 (1970). The details of the above method will be described later. The crystal obtained by the conventional liquid encapsulated pulling method contains much impurities, because this method adapts the separately synthesized gallium arsenide as its starting material. In contrast, the crystal obtained by the direct synthesized liquid encapsulated pulling method contains less impurities and is so-called "intrinsic semiconductor", because this method synthesizes gallium arsenide by reacting directly gallium and arsenic and from its melt grows crystal under high pressure. Under the present conditions, however, crystals developed by this method have high impurities content and the necessity of high pressure makes an inner construction of a furnace different from the conventional one and makes crystal growth process difficult. Moreover, there are many technical problems to be solved such as high density of dislocation and shift from stoichiometry, which is common with the conventional pulling method.

SUMMARY OF THE INVENTION

The object of the present invention is to solve the above-described problems of the conventional techniques and to offer a manufacturing process of a semi-insulating gallium arsenide single crystal by which electrical properties are improved and thermal instability is substantially reduced, and it is characteristic in providing film layer of 8–20 mm thickness of melted boron oxide with less than 200 ppm of water content over gallium arsenide melt, rotating the seed crystal and the melt in the crucible into the same direction under controlled pressure of 60 kg/cm² during reaction and 5–40 kg/cm² during crystal growth in the inert gas atmosphere, with the seed crystals rotating 5–30 rpm faster than the melt in the crucible and using seed crystal whose seeding surface is set within ±3° from {100} plane.

DESCRIPTION OF THE PREFERRED EMBODIMENT

Figure 1:
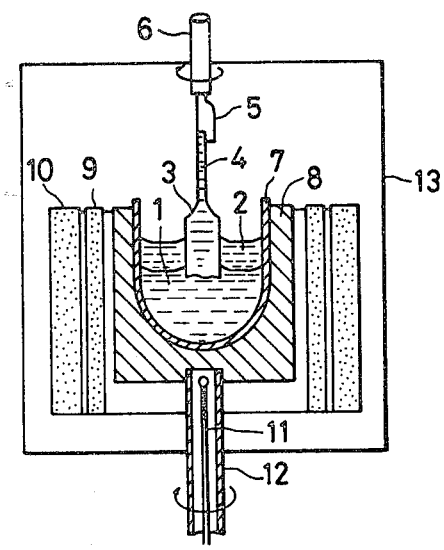
FIG. 1 is a vertical cross-sectional view of one embodiment of the present invention illustrating the manufacturing process of gallium arsenide single crystal.

FIG. 1 is the vertical cross-sectional view of one embodiment of the present invention showing a manufacturing apparatus of gallium arsenide single crystal. Seed holder 5 to hold seed crystal 4 is supported by the pulling rotary shaft 6, and pulled single crystal 3 is produced under the seed crystal 4 and keeps contact with gallium arsenide melt 1. The gallium arsenide melt 1, together with the boron oxide solution 2 floating above it, is contained in crucible 7. The crucible 7 is contained in the carbon susceptor 8 rotatably supported by the susceptor rotary shaft 12 and surrounded by carbon heater 9 and carbon felt 10. A thermocouple 11 is inserted into the susceptor rotary shaft 12 and the pressure container 13 contains the set of the melting furnace so that the susceptor rotary shaft 12 and the pulling rotary shaft 6 are tightly sealed.

Figure 2:
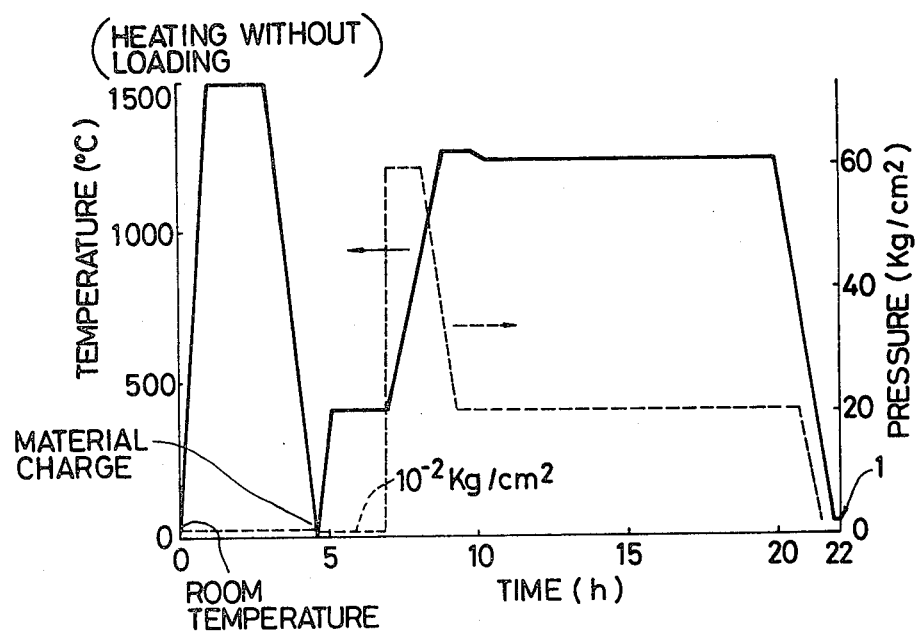
FIG. 2 is a diagram showing the temperature and the pressure in the furnace during production of gallium arsenide single crystal of FIG. 1.

FIG. 2 is a diagram showing the temperature and the pressure in the melting furnace of FIG. 1, during growth of gallium arsenide single crystal. The left ordinate indicates the temperature and the right ordinate indicates the pressure. The solid line shows the temperature in the furnace. The furnace was heated without loading at 1500° C. for two hours in argon gas and then cooled down to the room temperature. After that, 500 g of gallium of 99.9999% purity and a definite quantity of arsenic of 99.9999% purity were put into the crucible 7 made of pyrolytic boron nitride material and then boron oxide ($B_2O_3$), which is of 200 ppm water content, less than 3 ppm of the total impurity content and less than 1 ppm of each impurity matter was put into the crucible. The crucible 7 which was charged with the materials in the above way was put into the carbon susceptor 8 and the pressure container 13 was sealed.

After the atmosphere in the pressure container 13 was changed with argon gas, it was evacuated to approximately $10^{-2}$ kg/cm² as indicated by the dashed line for about two hours with the temperature raised to 300°-400° C. and monitored by the thermocouple 11. In this manner, water content or impure vapor adhering to the inner surface of the furnace or the materials were removed. The inner atmosphere of the pressure container 13 was changed into argon gas of 60 kg/cm$^2$ and then the temperature was raised. Boron oxide ($B_2O_3$) melted at approximately 500° C. into boron oxide melt 2 of approximately 20 mm thickness. The temperature being further raised and reaching approximately 700° C., the materials reacted to each other. Gallium arsenide melt 1 was obtained by gradually reducing gas pressure to be kept at 20 kg/cm$^2$ and raising the temperature to 1250° C., and the result shown in FIG. 1 was obtained.

Then the temperature was slightly raised and seeding was carried out at the appropriate temperature. On this occasion, the crucible 7 and seed crystal 4 were rotated into the same direction, but the rotational rate of the crucible 7 was 2 rpm and that of the seed crystal 4 was 7 rpm and the pulling speed of the seed crystal 4 was set at 10 mm/h. The diameter of the pulled single crystal 3 was controlled by detecting the weight and pulling position of the crystal with use of an automatic diameter control system. The crystal growth direction was <100>±3°.

The gallium arsenide single crystal obtained by the above method had an outer diameter of approximately 51 mm and total length of approximately 100 mm, and its dislocation density was 500-5000 cm$^{-2}$ in low region and 10$^4$ cm$^{-2}$ even in high region. A small amount of gallium was precipitated around the crystal, but, as a whole, no gallium had been contained in the crystal. In order to know the electric properties of this crystal, a thin slice of 400 μm thickness was taken out of the crystal and both of its sides were coated with AuGe/Ni evaporated film, and then the resistivity was measured by a curve tracer and the average value of 10$^8$-10$^9$ Ω.cm was obtained. When voltage of 200 V was applied between two tungsten needles put on the surface of the cut out crystal substrate with 1 mm apart from each other, the measured surface leak current was below 0.1 μA. Then, the substrate was thermally treated in hydrogen atmosphere at 850° C. for thirty minutes as a simulation of thermal treatment performed during processing elements, and it was measured in the same method. As a result, the resistivity was about 10$^8$ Ω.cm and the average surface leak current was about 5 μA. The obtained product was semi-insulating gallium arsenide single crystal with excellent electric properties, thermal stability and good crystallization.

The water content in raw materials should be completely removed because, with the water content of 200 ppm and over, boron oxide melt becomes turbid, observation of crystal growth is disturbed and gas bubbles are produced and adhere onto the surface of growing crystal to deteriorate crystallization. 8-20 mm thickness is favorable for boron oxide melt 2 for the reason that volatilization of arsenide from gallium arsenic solution 1 cannot be controlled under 8 mm thickness, and over 20 mm thickness, the surface of crystal growth becomes unobservable and it is difficult to uniformalize the temperature distribution of gallium arsenide melt 1. (See Table 1.)

The reaction between materials and formation of melt should be carried out in high purity inert gas atmosphere of argon or nitrogen, etc. The reason for raising the gas pressure up to 60 kg/cm$^2$ during reaction of materials is to prevent volatilization of arsenic through boron oxide melt 2. Actually, the vapor pressure of arsenic at reaction temperature reaches several scores kg/cm$^2$. If more than 20% of arsenic volatilizes, gallium arsenide solution will have a great shift from stoichiometry.

150 kg/cm$^2$ is a limit pressure for this apparatus, and furnace apparatus which endures higher pressure than this is difficult to design and requires higher cost. The dashed line in FIG. 2 indicates that the pressure is set at about 20 kg/cm$^2$ during crystal growth, and the average pressure between 5 kg/cm$^2$-40 kg/cm$^2$ is appropriate. Volatilization from gallium arsenide solution is unavoidable below 5 kg/cm$^2$ and the temperature distribution in the furnace is incontrollable because of heavy thermal convection above 40 kg/cm$^2$ pressure. (See Table 2.)

The crucible 7 to contain materials is made of such materials as high purity alimina, quartz glass, boron nitride, pyrolitic boron nitride. A quartz glass crucible is generally used, but, from the viewpoint of the properties of single crystal to be obtained, it is desirable to make a crucible with pyrolitic boron nitride into which impurities are awkward to take in the crystal. Within a practical crystal pulling method, seed crystal 4 keeps contact with the gallium arsenide solution 1 produced in the crucible 7. The crucible 7 and the seed crystal 4 are rotated in the same direction. In case that one of them is rotated into the reverse direction, a part of the solution stagnates in a wide range of middle area on the surface of the solution and that disturbs the crystal growth. The seed crystal 4 is rotated faster than the crucible 7 and the difference in their rotational rate should be preferably 5-30 rpm. If the difference gets larger than 30 rpm, a part of the solution stagnates in the middle area. (See Table 3.)

Moreover, as {100} planes are applied to devices, semi-insulation gallium arsenide is grown to <100> direction and the orientation of seed crystal should be within ±3° from {100} plane. Seeding will be disturbed and twins will be easily generate during crystal growth over the said value of difference.

The followings are the experiments carried out to obtain conditions of the above-described embodiment:

EXPERIMENT I

Test results to obtain conditions for boron oxide are shown in Table 1, a-f represent the samples tested.

TABLE 1

|  | a | b | c | d | e | f |
| --- | --- | --- | --- | --- | --- | --- |
| Water content in boron oxide (ppm) | 200 | 200 | 100 | 200 | 300 | 200 |
| Thickness of boron oxide solution (mm) | 5 | 8 | 20 | 20 | 20 | 25 |
| Volatility of arsenic | high | low | low | low | low | low |
| Relative difficulties of observation | large | small | small | small | slightly large | slightly large |

TABLE 1-continued

|  | a | b | c | d | e | f |
|---|---|---|---|---|---|---|
| of crystal growth Crystallization of pulled crystal | much dis- location | good | good | good | much dis- location | many twins and tilt boundary granules |

It is apparent from the test results that the thickness of boron oxide solution is desirable to be 8–20 mm and that the result is better with less water content.

EXPERIMENT II

Test results to obtain conditions of atmosphere gas pressure are shown in Table 2. g–m represent the sample tested.

TABLE 2

|  | g | h | i | j | k | l | m |
|---|---|---|---|---|---|---|---|
| Pressure during reaction (kg/cm$^2$) | 60 | 60 | 60 | 50 | 80 | 60 | 60 |
| Pressure during crystal growth (kg/cm$^2$) | 3 | 5 | 20 | 20 | 20 | 40 | 50 |
| Volitilized arsenic during reaction | little | little | little | much | little | little | little |
| Volitilized arsenic during crystal growth | much | little | little | little | little | little | little |
| Uniformity of temperature in a furnace | good | good | good | good | good | slightly not good | difficult (large thermal con- vection |
| Crystallization | Ga is pre- cipitated | good | good | Ga is pre- cipitated | good | good | tilt boundary granules are generated |

It was confirmed from the results that volatilization of arsenic from the solution increases and that Ga is precipitated in crystal when the pressure during reaction or the pressure during crystal growth is low, and that the disorder of the temperature distribution in the furnace increases, the control of crystal growth is difficult and the tilt boundary granules increase when the pressure during reaction or the pressure during crystal growth is high. The pressure during reaction is desirable to be over 60 kg/cm$^2$ and the pressure during crystal growth is desirable to be 5–40 kg/cm$^2$.

EXPERIMENT III

Test results to obtain rotating conditions of the melting pot and seed crystal are shown in Table 3, n–t represent samples tested.

TABLE 3

|  | n | o | p | q | r | s | t |
|---|---|---|---|---|---|---|---|
| Rotational directions of seed crystal and crucible | same | same | same | same | same | reverse | reverse |
| Difference of rotational rates between seed crystal and crucible (rpm) | −5 | 3 | 5 | 30 | 35 | 5 | 30 |
| The surface area of melt stagnated | wide | wide | none | none | wide | wide | wide |

The differences of rotational rates are indicated with positive figures when that of the seed crystal is larger, and with negative figures when that of the crucible is larger. It was confirmed from the test results that no stagnating portion is seen when the rotational rate of the seed crystal exceeds that of the crucible by 5–30 rpm, both being rotated in the same direction.

Another experiment was carried out with the crystal growth direction set <100>±5° and other conditions were the same with those of the above embodiment. It was confirmed that seeding was disturbed, and that the growing crystal becomes easily polycrystals as twins are generated. In some cases, although the seed crystal was {100} plane, it grew <111> direction. For this reason, the growing plane should be within ±3° from {100}.

Yet, another experiment was carried out with use of a quartz glass crucible and under the same conditions with the above embodiment, and, as a result, the resistivity of the crystal was $10^7$–$10^8$ cm which is somewhat smaller than that of the boron nitride embodiment, but the crystal has the equal properties with those of the above embodiment in other points.

The manufacturing process of gallium arsenide single crystal according to the embodiment has an effect that the materials contained in a crucible made of quartz glass or pyrolitic boron nitride is reacted by heating in high pressure inert gas atmosphere, made into gallium arsenide melt with reducing gas pressure and further increasing the heating temperature and the single crystal is grown by seeding the seed crystal rotated faster than the crucible on the surface of the above melt, and thus semi-insulating gallium arsenide single crystal with excellent electric properties and thermal stability is efficiently produced.

The above embodiment is a manufacturing process of high purity gallium arsenide single crystal, and semi-insulating gallium arsenide with the same properties as the former crystal is also obtainable with a similar crystal growing method by adding a dopant having deep impurity level as chrome or oxygen in raw materials. Thus, the present invention contributes to the improvement of manufacturing processes of Hall elements, FET, LSI, etc.

The manufacturing process of the invention efficiently produces semi-insulating gallium arsenide single crystal of excellent electric properties and thermal stability.

What is claimed is:

1. A manufacturing process of a semi-insulating gallium arsenide single crystal wherein the semi-insulating gallium arsenide single crystal is grown by pulling a seed crystal contacted with gallium arsenide melt; said melt being obtained by heat-reacting gallium and arsenic in a crucible contained in a pressure container under pressure controlled at 60 kg/cm$^2$ and over during reaction and at 5–40 kg/cm$^2$ during crystal growth in high purity inert gas atmosphere; said melt being characteristic in having a film layer of 8–20 mm thickness of melted boron oxide with less than 200 ppm water content being provided over its upper surface; and during said crystal growth, said seed crystal and said crucible being rotated in the same direction, but said seed crystal being rotated 5–30 rpm faster than said crucible; and the crystal growing plane of said seed crystal being controlled to be within ±3° from {100} plane.

* * * * *